(12) United States Patent
Loeffler et al.

(10) Patent No.: US 10,784,653 B2
(45) Date of Patent: Sep. 22, 2020

(54) LASER BARS HAVING TRENCHES

(71) Applicant: OSRAM OLED GmbH, Regensburg (DE)

(72) Inventors: Andreas Loeffler, Neutraubling (DE); Clemens Vierheilig, Tegernheim (DE); Sven Gerhard, Alteglofsheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/079,678

(22) PCT Filed: Feb. 23, 2017

(86) PCT No.: PCT/EP2017/054232
§ 371 (c)(1),
(2) Date: Aug. 24, 2018

(87) PCT Pub. No.: WO2017/144613
PCT Pub. Date: Aug. 31, 2017

(65) Prior Publication Data
US 2019/0052062 A1 Feb. 14, 2019

(30) Foreign Application Priority Data
Feb. 25, 2016 (DE) .......................... 10 2016 103 358

(51) Int. Cl.
*H01S 5/22* (2006.01)
*H01S 5/40* (2006.01)
*H01L 25/16* (2006.01)
(Continued)

(52) U.S. Cl.
CPC .......... *H01S 5/4031* (2013.01); *H01L 25/167* (2013.01); *H01L 33/0075* (2013.01);
(Continued)

(58) Field of Classification Search
CPC .. H01S 5/4031; H01S 5/34333; H01S 5/0421; H01S 5/0208; H01S 5/0207;
(Continued)

(56) References Cited

U.S. PATENT DOCUMENTS

| 4,674,095 A | 6/1987 | Heinen et al. |
| 5,920,584 A | 7/1999 | Dohle et al. |

(Continued)

FOREIGN PATENT DOCUMENTS

| CN | 1682418 A | 10/2005 |
| CN | 101800399 A | 8/2010 |

(Continued)

OTHER PUBLICATIONS

First Office Action dated Sep. 29, 2019, of counterpart Chinese Application No. 201780013548.1, along with an English translation.

*Primary Examiner* — Xinning(Tom) Niu
(74) *Attorney, Agent, or Firm* — DLA Piper LLP (US)

(57) ABSTRACT

A laser bar includes a semiconductor layer including a plurality of layers and includes an active zone, wherein the active zone is arranged in an x-y-plane, laser diodes each form a mode space in an x-direction between two end faces, the mode spaces of the laser diodes are arranged alongside one another in a y-direction, a trench is provided in the semiconductor layer between two mode spaces, the trenches extend in the x-direction, and the trenches extend from a top side of the semiconductor layer in a z-direction to a predefined depth in the direction of the active zone.

17 Claims, 6 Drawing Sheets

(51) Int. Cl.
*H01L 33/00* (2010.01)
*H01L 33/22* (2010.01)
*H01L 33/24* (2010.01)
*H01L 33/32* (2010.01)
*H01S 5/02* (2006.01)
*H01S 5/042* (2006.01)
*H01S 5/343* (2006.01)
*H01S 5/323* (2006.01)
*H01S 5/227* (2006.01)

(52) U.S. Cl.
CPC .......... *H01L 33/0095* (2013.01); *H01L 33/22* (2013.01); *H01L 33/24* (2013.01); *H01L 33/32* (2013.01); *H01S 5/0207* (2013.01); *H01S 5/0208* (2013.01); *H01S 5/0421* (2013.01); *H01S 5/22* (2013.01); *H01S 5/34333* (2013.01); *H01S 5/2219* (2013.01); *H01S 5/2275* (2013.01); *H01S 5/32341* (2013.01); *H01S 2304/12* (2013.01)

(58) Field of Classification Search
CPC ......... H01L 33/24; H01L 33/32; H01L 33/22; H01L 33/0095; H01L 33/0075; H01L 25/167
See application file for complete search history.

(56) References Cited

U.S. PATENT DOCUMENTS

| | | | |
|---|---|---|---|
| 7,529,284 B2 | 5/2009 | Karnutsch et al. | |
| 2001/0040906 A1* | 11/2001 | Kikuchi | H01S 5/4031 372/43.01 |
| 2004/0206975 A1 | 10/2004 | Tojo et al. | |
| 2008/0063021 A1* | 3/2008 | Seo | B82Y 20/00 372/87 |
| 2008/0089374 A1* | 4/2008 | Eichler | H01S 5/22 372/45.01 |
| 2010/0202480 A1 | 8/2010 | Kuramoto | |
| 2015/0287880 A1* | 10/2015 | Zini | H01L 33/0095 257/98 |

FOREIGN PATENT DOCUMENTS

| | | |
|---|---|---|
| CN | 103354253 A | 10/2013 |
| DE | 196 44 941 C1 | 1/1998 |
| DE | 198 21 544 | 12/1999 |
| DE | 10 2009 047 791 | 3/2011 |
| EP | 0 957 548 | 11/1999 |
| JP | 2012-204364 A | 10/2012 |

* cited by examiner

LASER BARS HAVING TRENCHES

TECHNICAL FIELD

This disclosure relates to a laser bar and a method of producing a laser bar.

BACKGROUND

A high-power diode laser is known from DE 196 44 941 C1, wherein a laser bar comprising a plurality of laser diodes is provided, and the laser diodes are separated from one another by predefined breaking locations in the laser bar. After the laser bar has been soldered onto a heat sink comprising a lower coefficient of expansion and has been cooled, the trenches lead to predefined breaking locations and breaking. As a result of the physical splitting of the laser bar, the use of a solder comprising low ductility at room temperature is possible since destruction of the individual laser diodes of the laser bar owing to mechanical stresses may be precluded. In addition, a trench is introduced in the surface between two further laser diodes.

There is nonetheless a need to provide an improved laser bar comprising a plurality of laser diodes, wherein in particular a mechanical stability of the laser bar is improved, and in addition optical properties of the laser diodes are improved.

SUMMARY

A laser bar includes a semiconductor layer including a plurality of layers and includes an active zone, wherein the active zone is arranged in an x-y-plane, laser diodes each form a mode space in an x-direction between two end faces, the mode spaces of the laser diodes are arranged alongside one another in a y-direction, a trench is provided in the semiconductor layer between two mode spaces, the trenches extend in the x-direction, and the trenches extend from a top side of the semiconductor layer in a z-direction to a predefined depth in the direction of the active zone.

LIST OF REFERENCE SIGNS

1 Laser bar
2 First side
3 Trench
4 Mode
5 Ridge
6 Second side
7 Second trench
8 Material
9 Connection layer
10 Carrier
11 Semiconductor layer
12 Laser diode
13 First end face
14 Second end face
15 Active zone
16 Substrate
17 Electrical line
18 Insulation layer
19 Side face of second trench
20 Bottom face of second trench

DETAILED DESCRIPTION

Our laser bar comprising semiconductor layers comprises an active zone, wherein the active zone is arranged in an x-y-plane, laser diodes each form a mode space in an x-direction between two end faces, the mode spaces of the laser diodes are arranged alongside one another in the y-direction, a first trench is provided between two mode spaces, and the first trenches extend in the x-direction, the first trenches comprise a predefined width in the y-direction and a predefined depth in the z-direction. Mechanical stresses in the laser bar are reduced by the trenches. The first trenches extend from a top side of the semiconductor layer in the z-direction right into the active zone. The first trenches may extend from a top side of the semiconductor layer in the z-direction in the direction of the active zone, but also end above the active zone. A focusing of the current density onto the desired region of the active zone is achieved as a result. The trenches may also extend beyond the active zone.

A second laser diode comprising a second mode space may be arranged in the y-direction between two first trenches, wherein the second mode space extends in the x-direction between the two end faces.

A second trench may be provided between the two laser diodes arranged between two first trenches, wherein the second trench extends along the x-direction, and the second trench comprises a smaller depth in the z-direction than the first trench.

The second trench may extend in the z-direction right into the active zone of the first and second laser diodes. The second trench may extend beyond the active zone.

The second trench may extend in the z-direction not right into the active zone of the first and second laser diodes, but rather ends above the active zone.

The second trenches may be filled with a material, in particular with a material that absorbs electromagnetic radiation of the laser diode.

The laser bar may be mounted on a carrier.

The laser bar may be mounted onto the carrier with the side in which the trenches are introduced facing downward.

The first trenches may comprise a width in the y-direction of 1 to 100 µm or more, in particular a width in the region of 50 µm.

The second trenches may comprise a width in the y-direction of 1 to 100 µm or more, in particular in the region of 50 µm.

The semiconductor layer may be formed from a GaN material system, in particular from a GaN material system comprising Al and/or In.

The absorbing material may be filled into the second trench. Consequently, the absorbing material may be selected independently of the material of the semiconductor layer. As a result, the layer microstructure of the semiconductor layer remains interrupted by formation of the second trench and the later filling of the second trench. A reduction of layer stresses and a smaller build-up of layer stresses in the semiconductor layer even in the event of temperature changes are thus achieved. In addition, it is possible to make a better choice of the material for an absorbing and/or a thermally conductive function. The absorbing material may e.g. comprise better thermal conductivity than the material of the semiconductor layer. A better heat dissipation from the active zones may be achieved as a result.

The absorbing material may comprise a metal or consists of a metal, in particular a contact metal. Metal has a good thermal conductivity and may be introduced into the second trenches by reliable methods.

In an absorbing material comprising an electrically conductive material, it is advantageous to form an insulation layer between the absorbing material and the semiconductor layer at least in a section of the second trench to avoid an electrical short circuit between the differently doped layers of the active zone.

In an absorbing material comprising an electrically conductive material, it is advantageous, if the first trench extends into or through the active zone, to form an insulation layer between the absorbing material and the semiconductor layer at least in a section of the first trench to avoid an electrical short circuit between the differently doped layers of the active zone.

The second trench and the absorbing material may be led right under the active zone, wherein the absorbing material is electrically conductive, and the absorbing material of the second trench constitutes an electrical through contact for the semiconductor layer under the active zone. In this case, an upper section of the trench is provided with an insulation layer. As a result, it is possible to achieve a simple electrical contacting of the layer below the active zone, which additionally also enables good heat dissipation.

The above-described properties, features and advantages and the way in which they are achieved will become clearer and more clearly understood in association with the following description of examples explained in greater detail in association with the drawings.

Figure 1:
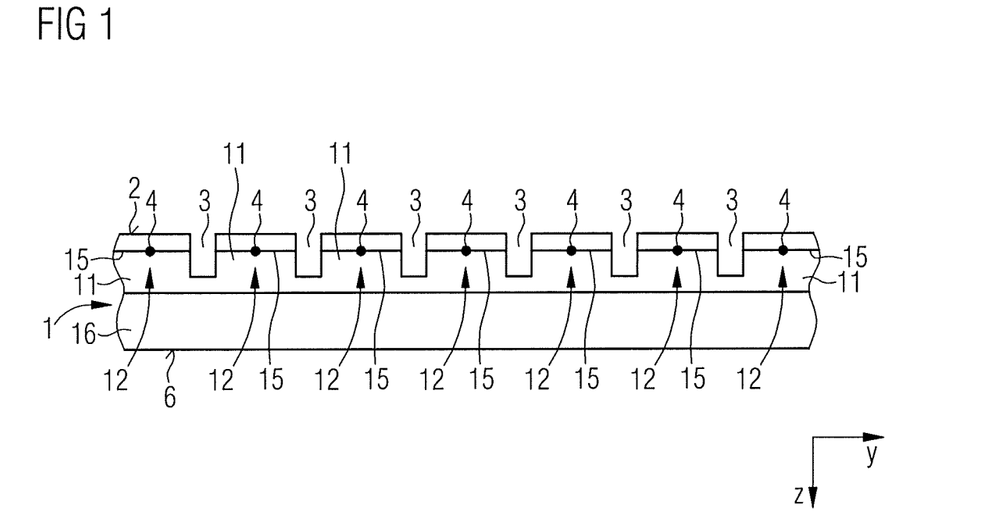
FIG. 1 shows a schematic cross section through one example of a laser bar.

FIG. 1 shows, in a schematic illustration, a laser bar 1 in cross section. The laser bar 1 comprises trenches 3 on a first side 2. The trenches 3 are aligned along an x-axis perpendicular to the plane of the drawing. The trenches 3 extend in the z-axis as far as a predefined depth. In addition, the trenches 3 comprise a predefined width in the y-axis. The width of the trenches 3 is 1 to 100 μm, preferably in the region of 50 μm. The depth of the trenches 3 is 0.1 to 10 μm, in particular in the region of 5 μm. The laser bar 1 comprises in the upper region a semiconductor layer 11 comprising a plurality of layers arranged in an x-y-plane and comprises an active zone 15 that generates electromagnetic radiation. The semiconductor layer 11 is arranged on a substrate 16. The trenches 3 may lead right under the active zone 15 of the semiconductor layer 11. In addition, the trenches 3 may lead right into the substrate 16. The substrate 16 may also be dispensed with.

The semiconductor layer 11 comprises a layer sequence in which e.g. a p-n junction is formed between a positively conducting semiconductor layer and a negatively conducting semiconductor layer such that the active zone 15 is formed. The active zone 15 is configured to generate an electromagnetic radiation when a predefined voltage is applied. The active layer may comprise a quantum well structure. The active zone may also comprise quantum wells or quantum well structures. The semiconductor layer 11 may comprise on a p-side with respect to the active zone 15 a plurality of p-doped semiconductor layers arranged one above another, which semiconductor layers may differ in terms of doping and/or in terms of composition. In addition, the semiconductor layer 11 comprises on an n-side with respect to the active zone 15 a plurality of n-doped semiconductor layers that may differ in terms of doping and/or in terms of composition. The semiconductor layer 11 may comprise a layer sequence comprising a GaN material system comprising Al and/or In or consist of a GaN material system comprising Al and/or In.

The semiconductor layer sequence is formed such that a laser diode 12 is formed between two trenches 3, wherein the electromagnetic radiation generated by the laser diode 12 is guided in a mode 4 between two end faces of the laser bar. The end faces are each arranged in the z-y-plane and formed in an at least partly reflective fashion. At least one end face is formed such that electromagnetic radiation is coupled out.

Individual laser diodes 15 may be subdivided by the trenches 3. The trenches 3 may comprise e.g. a width in the y-axis of 10 μm to 100 μm, preferably in the region of 50 μm.

Figure 2:
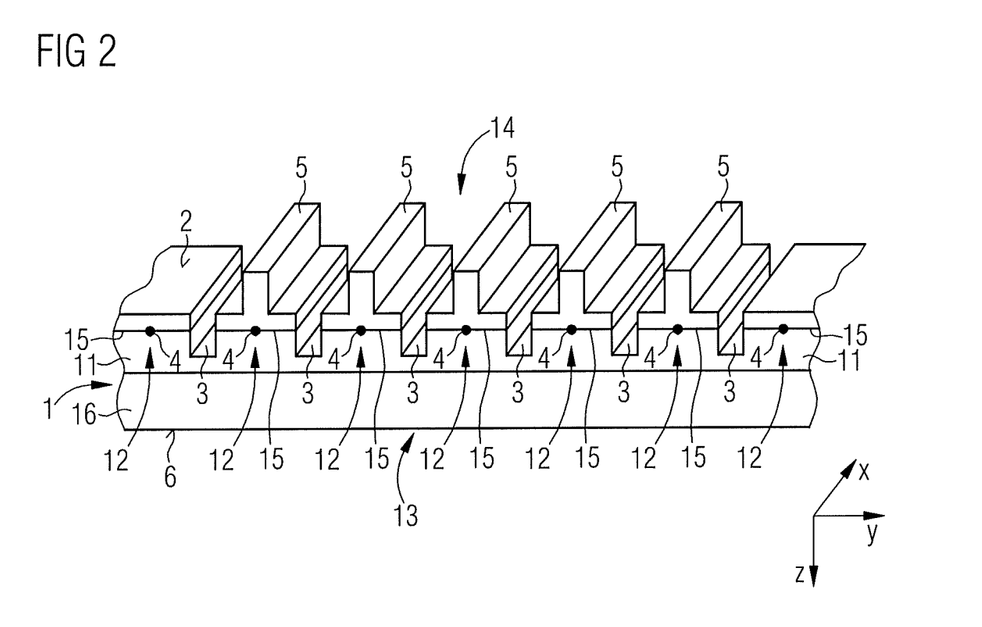
FIG. 2 shows a plan view of the arrangement from FIG. 1.

FIG. 2 shows, in an enlarged perspective illustration, a plan view of an excerpt from the arrangement from FIG. 1, wherein ridges 5 are formed on the first side 2. The ridges 5 are arranged along the x-axis parallel to one another and between two end faces 13,14. The ridges 5 are formed from a patterned semiconductor material and form a ridge structure that guides an optical mode of the laser diode along the longitudinal direction. The ridges 5 may comprise a height in the z-direction of 1 to 2000 nm. In addition, the ridges 5 may be provided with an electrical contact constituting a first electrical terminal of a laser diode 12. Below each ridge 5, an optical mode 4 is formed during operation of the laser diode 12. Between the ridges 5, the trenches 3 are introduced into the first side 2 of the laser bar 1. A positively doped semiconductor layer is assigned to the first side 2 and a negatively doped semiconductor layer is assigned to an opposite second side 6.

Figure 3:
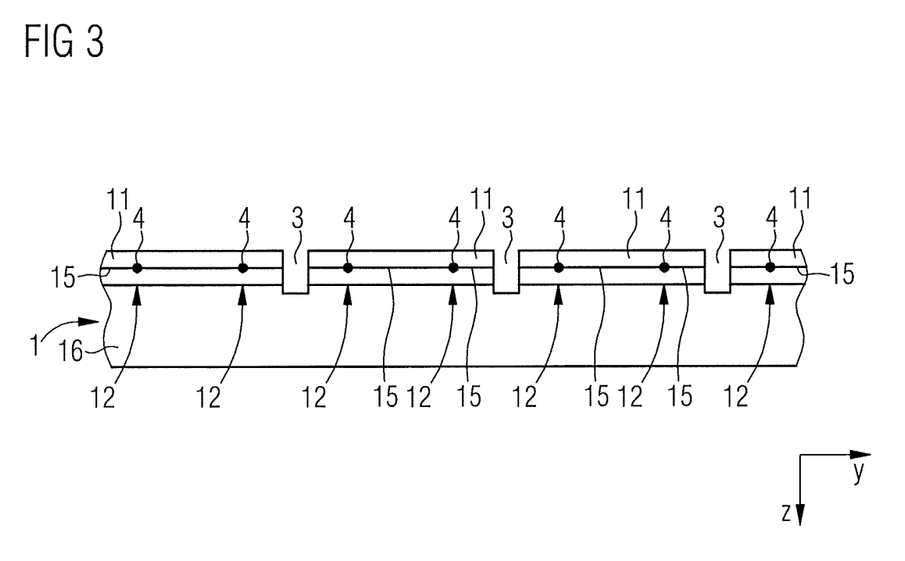
FIG. 3 shows a cross section through a further example.

FIG. 3 shows, in a schematic cross section, a further example of a laser bar 1 formed substantially in accordance with the example from FIG. 1, but two modes 4 are arranged between two trenches 3. More than two modes 4 may also be provided between two trenches 3. There may be a corresponding ridge associated with each mode 4, these ridges not being explicitly illustrated.

Figure 4:
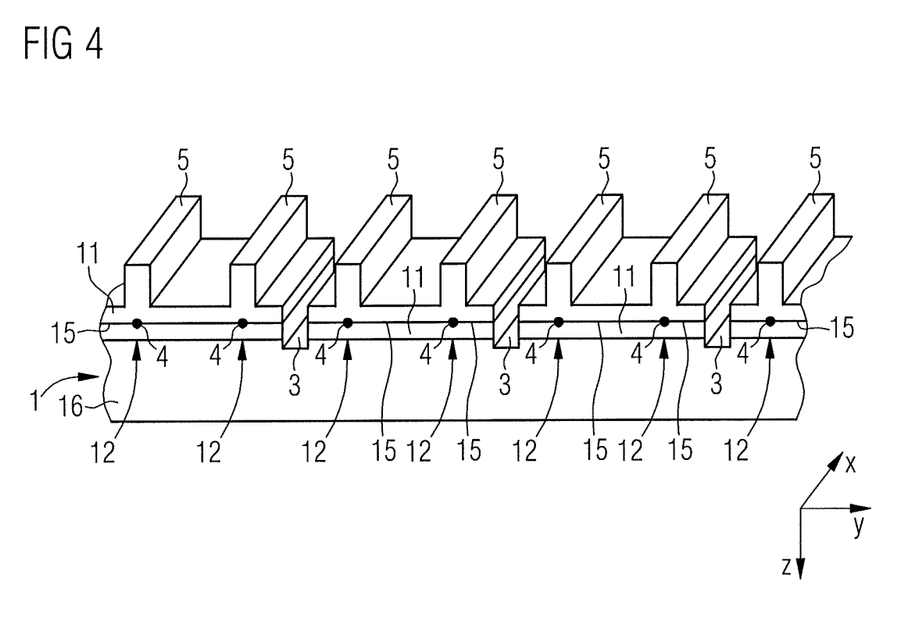
FIG. 4 shows a plan view of the further example from FIG. 3.

FIG. 4 shows, in a partly perspective illustration, a partial excerpt from the laser bar 1 from FIG. 3. Consequently, two laser diodes 12 comprising two ridges 5 are also arranged between two trenches 3, wherein each laser diode 12 may form a mode 4 between two trenches 3 during operation. The trenches 3 may extend right into the substrate 16. In the laser bar 1 more than two laser diodes 12 comprising two ridges 5 may also be arranged between two trenches 3, wherein each laser diode 12 may form a mode 4 between two trenches 3 during operation.

Figure 5:
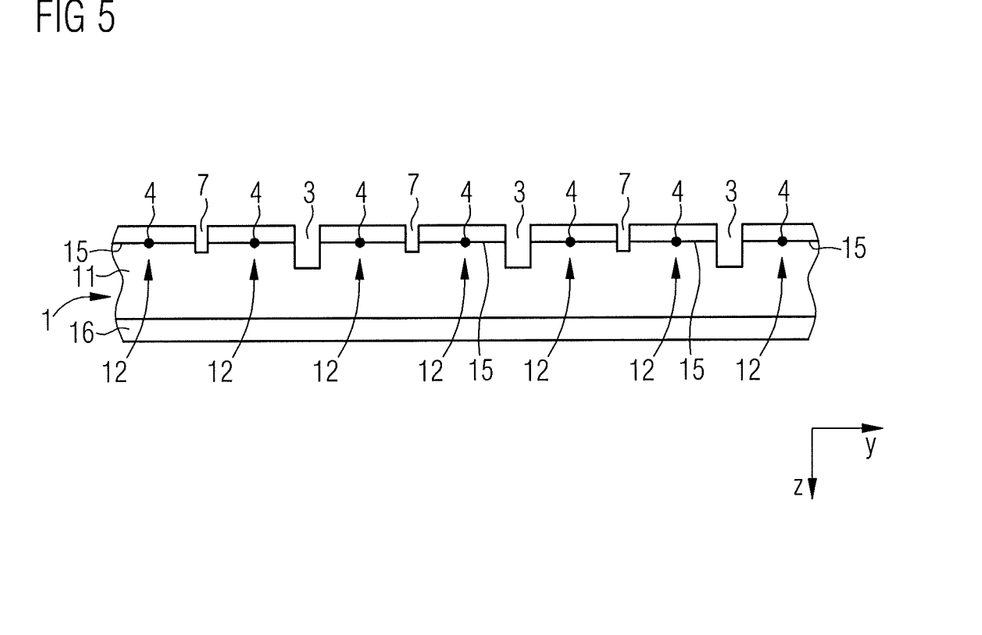
FIG. 5 shows a schematic cross section through a further example of a laser bar.

FIG. 5 shows, in a schematic cross section, a further example of a laser bar 1 formed substantially in accordance with the example from FIG. 3, but a respective second trench 7 is arranged between two modes 4 of two laser didoes 12 arranged between two trenches 3. More than two modes 4 may also be provided between two trenches 3. A second trench 7 may be formed between two modes 4. The second trenches 7 may comprise a width of 1 to 100 µm, preferably 50 µm, in the y-direction. In addition, the second trenches 7 may comprise a depth of 0.3 to 5 µm, preferably of 1 µm, in the z-direction. The second trenches 7 may also extend right into the substrate 16.

Figure 6:
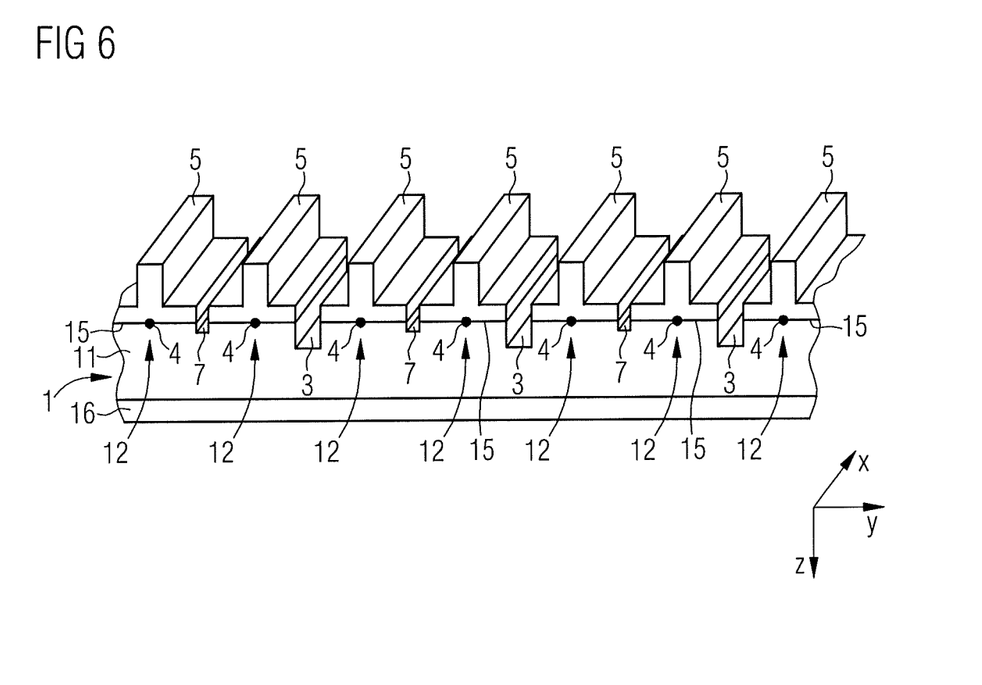
FIG. 6 shows an enlarged illustration of a plan view of the laser bar from FIG. 5.

FIG. 6 shows an enlarged partial excerpt from the arrangement from FIG. 5 in a perspective illustration. The modes 4 are each arranged centrally between a trench 3 and a second trench 7 in the y-direction. In one particular example, the modes 4 comprise a largest possible distance from the trenches 3. The distance between two modes 4 in the y-direction is smaller, in particular smaller by at least 10%, preferably 20%, than the distance between a mode 4 and the adjacent trench 3.

With the aid of the second trench 7, which is introduced into the first side 2 and is led, for example, right under the active zone of the semiconductor layer 11 in the z-direction, formation of parasitic modes in the laser diode 12 is additionally made more difficult.

The modes 4 are each spaced apart as far as possible from the trenches 3. In the example in which two modes 4 are arranged between two trenches 3, the distance between the two modes 4 is chosen to be as small as possible. The position of the modes 4 may substantially be defined by the position of the ridges 5.

Figure 7:
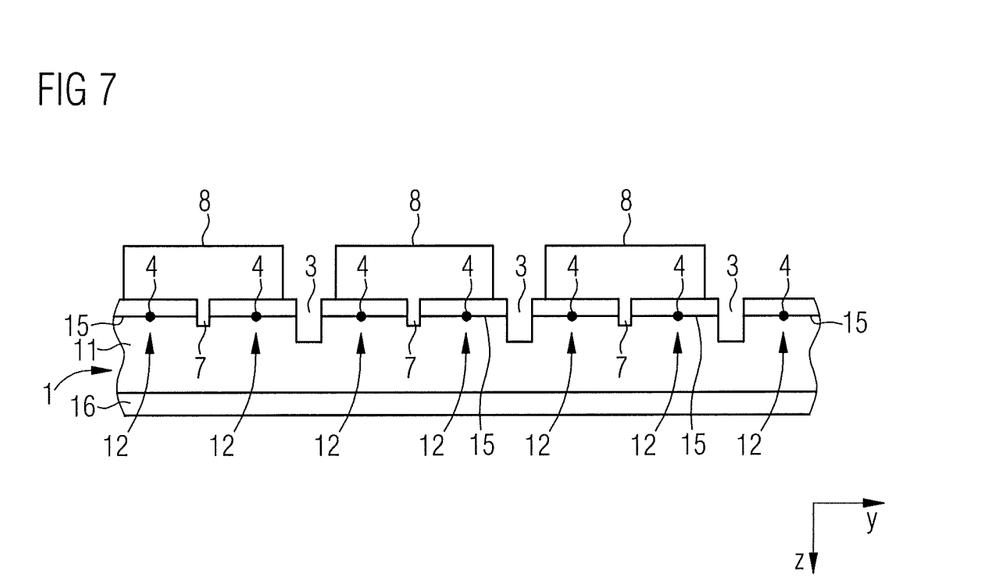
FIG. 7 shows a schematic cross section through a further example of a laser bar.

FIG. 7 shows, in a schematic cross section, a further example of a laser bar 1 formed substantially in accordance with the example from FIG. 5, but the second trenches 7 are at least partly or completely filled with an absorbing material 8. In the example illustrated, a part of the surface of the laser bar 3 is also filled with the material 8. In the x-direction the material 8 extends, for example, over the entire length of the laser bar 1. The absorbing material 8 is formed such that it absorbs at the laser wavelength of the laser diode. The material 8 may be, for example, a dielectric that absorbs at the wavelength of the laser diode. Alternatively, the second trenches 7 may also be filled with a layer system, wherein the first layer need not be formed in an electrically conductive fashion and absorption of the laser wavelength may take place in at least one second layer located above the first layer. The at least one second layer may in turn comprise dielectrics or semiconductor materials that absorb the laser wavelength of the laser diode, or metals such as e.g. Cr, Ti, Pt, Au and the like. The absorbing material 8 is configured to absorb at least 10%, in particular 50% or even 80% or more, of the electromagnetic radiation of the laser diodes emitted in the region of the trenches. In an analogous manner to the second trenches 7, the trenches 3 may also be at least partly or completely filled with an absorbing material 8. To that end, the same material as in the case of the second trenches may be used.

Figure 8:
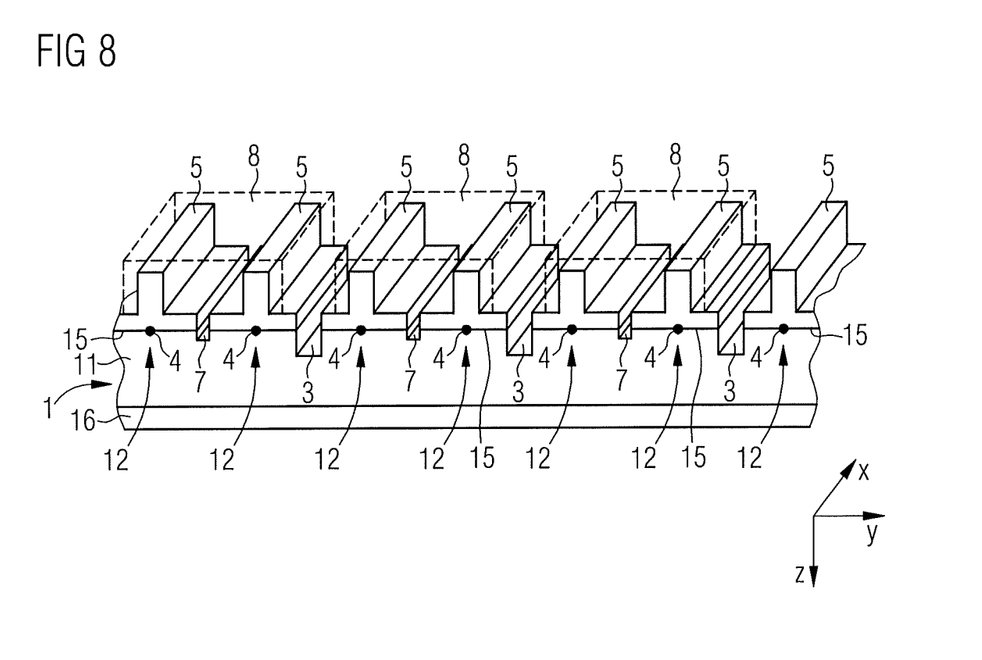
FIG. 8 shows a schematic plan view of an excerpt from the laser bar from FIG. 7.

FIG. 8 shows a schematic partial excerpt in a perspective illustration of the arrangement from FIG. 7, in which formation of the metal layer 8 is illustrated in a transparent manner, wherein the metal layer 8 is formed in the form of a strip covering both the second trench 7 and the ridges 5 of the two laser diodes arranged between two trenches 3. More than two laser diodes 12 comprising two modes 4 and corresponding ridges 5 may be arranged between two trenches 3. In addition, an electrical insulation layer may be formed between the material of the laser bar 3 and the material 8, in particular between the ridge 5 and the material 8.

The second trenches 7 may comprise a smaller depth in the z-direction than the trenches 3. In addition, the second trenches 7 may comprise a smaller width in the y-direction than the trenches 3. The trenches 3 and the second trenches 7 may comprise different shapes in cross section.

In addition, the first and second trenches 3, 7 may vary in width, depth and/or shape in the x-direction in all the examples.

Figure 9:
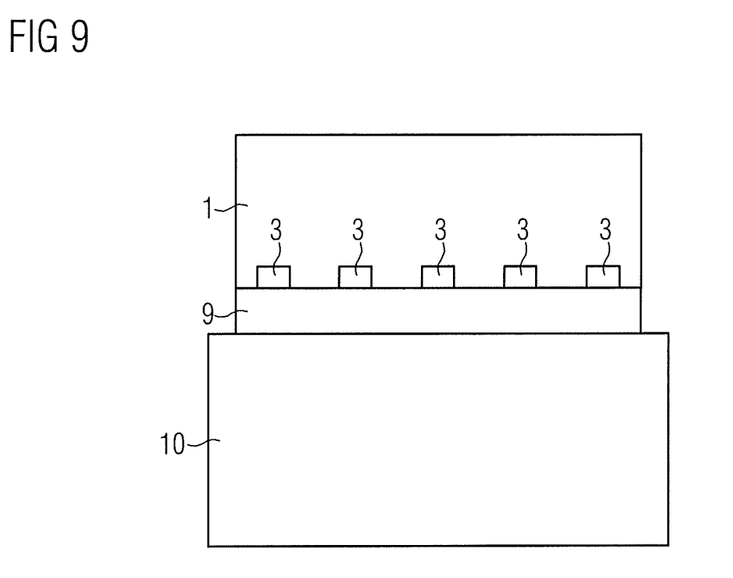
FIG. 9 shows a schematic illustration of a further laser bar on a carrier.

FIG. 9 shows, in a schematic illustration, a laser bar 1 secured on a carrier 10 via a connection layer 9 consisting of a solder material, for example. The carrier 10 may constitute a heat sink that dissipates heat from the laser bar 1.

The laser bar 1 may be mounted either on the p-side on the carrier 10 or on the n-side on the carrier 10, for example, via a thermally conductive layer, in particular a solder material.

Figure 10:
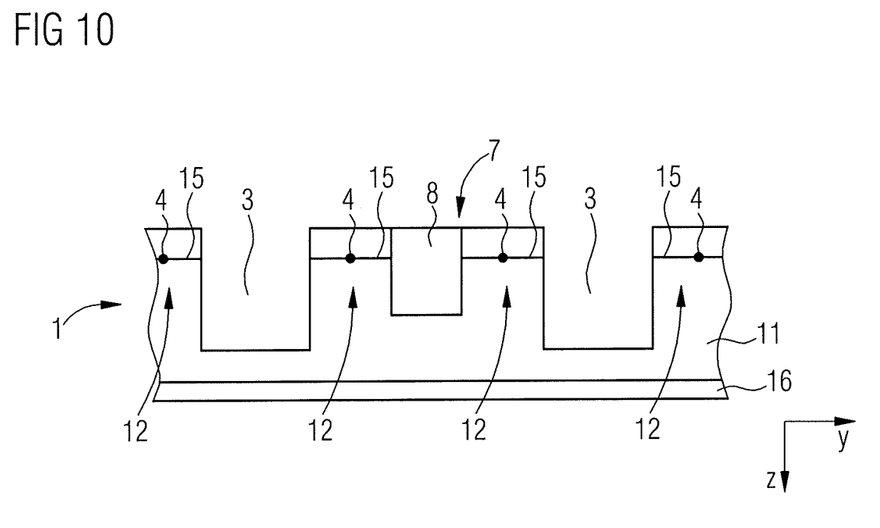
FIG. 10 shows a schematic partial cross-sectional illustration of a laser bar comprising a filled second trench.

FIG. 10 shows, in a schematic partial cross section, a further example of a laser bar 1 formed substantially in accordance with the example from FIG. 5, wherein a respective second trench 7 is arranged between two modes 4 of two laser diodes 12 arranged between two trenches 3. More than two modes 4 may also be provided between two trenches 3. A second trench 7 may be formed between two modes 4. The second trenches 7 may comprise a width of 1 to 100 µm, preferably 50 µm, in the y-direction. In addition, the second trenches 7 may comprise a depth of 0.3 to 5 µm, preferably of in the z-direction. The second trenches 7 may extend from a top side of the semiconductor layer 11 right into a region of the semiconductor layer 11 below the active zone 15 or even right into the substrate 16. The second trenches 7 are filled with an absorbing material 8 comprising a higher thermal conductivity than the material of the semiconductor layer 11. By virtue of the absorbing material 8, heat from the active zones 14 of the laser diodes 12 may be well dissipated downward in the direction of the substrate 16. In a further example, the second trenches 7 may also be filled with an absorbing material 8 comprising a thermal conductivity of the same magnitude as or lower than that of the material of the semiconductor layer 11.

Figure 11:
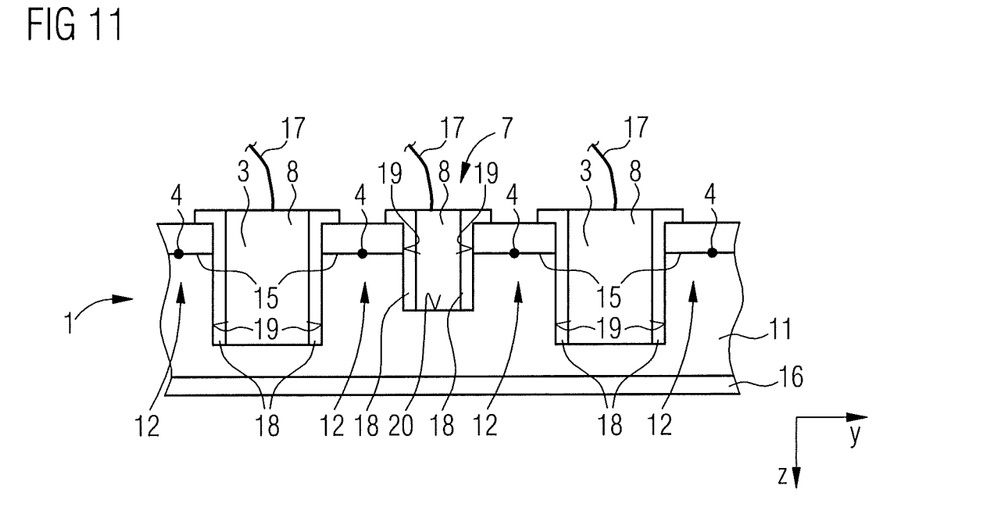
FIG. 11 shows a schematic partial cross-sectional illustration of a laser bar comprising filled first and second trenches.

FIG. 11 shows, in a schematic partial cross section, a further example of a laser bar 1 formed substantially in accordance with the example from FIG. 6. The second trenches 7 are covered with an insulation layer 18. An electrically conductive absorbing material 8 is introduced in the second trench 7, the material comprising in particular a higher thermal conductivity than the material of the semiconductor layer 11. The second trench 7 is led proceeding from the top side of the semiconductor layer 11 right under the active zone 15. The electrically conductive absorbing material 8, apart from a lower end section arranged below the active zone 15, is electrically insulated from the semiconductor layer 11 by an insulation layer 18. The insulation layer 18 may cover e.g. all sidewalls 19 of the second trenches 7. A bottom face 20 of the second trenches 7 is free of the insulation layer 18. The insulation layer 18 may consist e.g. of a semiconductor oxide, in particular of silicon oxide.

An electrical line 17 may be connected to a top side of the electrically conductive absorbing material 8. As a result, the semiconductor layer 11 may be electrically contacted below the active zone via the absorbing material 8. In addition, electrically conductive materials are suitable for a good heat conduction in the second trench 7. By virtue of the electrically conductive absorbing material 8, heat from the active zones 14 of the laser diodes 12 may be well dissipated downward in the direction of the substrate 16. The electrically conductive material 8 comprises e.g. a metal or consists of a metal. By way of example, a contact metal such as e.g. gold may be used as metal. The electrical line 17 may be formed e.g. as a bond wire.

The trenches 3 are covered with an insulation layer 18. An electrically conductive absorbing material 8 is introduced in the trench 3, the material comprising, for example, a higher thermal conductivity than the material of the semiconductor layer 11. The trench 3 is led proceeding from the top side of the semiconductor layer 11 right under the active zone 15. The electrically conductive absorbing material 8, apart from a lower end section arranged below the active zone 15, is electrically insulated from the semiconductor layer 11 by an insulation layer 18. The insulation layer 18 may cover e.g. all sidewalls 19 of the trenches 3. A bottom face 20 of the trenches 3 is free of the insulation layer 18. The insulation layer 18 may consist e.g. of a semiconductor oxide, in particular of silicon oxide.

An electrical line 17 may be connected to a top side of the electrically conductive absorbing material 8. As a result, the semiconductor layer 11 may be electrically contacted below the active zone via the absorbing material 8. In addition, electrically conductive materials are suitable for a good heat conduction in the trench 3. By virtue of the electrically conductive absorbing material 8, heat from the active zones 14 of the laser diodes 12 may be well dissipated downward in the direction of the substrate 16. The electrically conductive material 8 comprises e.g. a metal or consists of a metal. By way of example, a contact metal such as e.g. gold may be used as metal. The electrical line 17 may be formed e.g. as a bond wire.

It is also possible for only the trenches 3 or the second trenches 7 to be provided with an insulation layer 18 and an electrically conductive and absorbing material 8.

It is also possible for only a portion of the trenches 3 and/or a portion of the second trenches 7 to be provided with an insulation layer 18 and an electrically conductive and absorbing material 8.

If the trenches 3 do not extend right into the active zone 15, then the trenches 3 may also be filled with an electrically insulating and absorbing material. If the trenches 3 do not extend right into the active zone 15, then the trenches 3 may also be filled with an electrically conductive and absorbing material 8, wherein the insulation layer 18 may be dispensed with in this example. If the second trenches 7 do not extend right into the active zone 15, then the second trenches 7 may also be filled with an electrically conductive and absorbing material 8, wherein the insulation layer 18 may be dispensed with in this example. An electrical line 17 may be connected to a top side of the electrically conductive and absorbing material 8.

The examples in FIGS. 10 and 11 may also be provided with ridges 5 in accordance with the explanations of FIG. 8.

The trenches 3 and/or the second trenches 7 may be produced, for example, with the aid of an ELOG method in the semiconductor layer 11. The ELOG method is described in DE 10142656 A1, for example, and concerns a method in which the semiconductor layer 11 comprising a plurality of layers is deposited with the aid of an epitaxial lateral overgrowth method on a prepatterned mask such that the first and/or the second trenches 3,7 are formed on account of the mask during the deposition of the semiconductor layer 11.

In addition, the first and/or the second trenches 3,7 may be produced by a prepatterning of a substrate 16 with corresponding trenches and a subsequent deposition of the semiconductor layers onto the prepatterned side, wherein the first and/or the second trenches arise in the semiconductor layer 11 during deposition of the semiconductor layer. Furthermore, the first and/or the second trenches 3,7 may be introduced into the semiconductor layer 11 after deposition of the semiconductor layer 11, e.g. with the aid of etching methods.

Depending on the production method used, the first and/or the second trenches 3 may be formed only in the semiconductor layer 11 or extend right into the substrate 16.

Although our laser bars and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2016 103 358.8, the subject matter of which is incorporated herein by reference.

The invention claimed is:

1. A laser bar comprising a semiconductor layer comprising a plurality of layers and comprising an active zone, wherein the active zone is arranged in an x-y-plane, laser diodes each form a mode space in an x-direction between a first end face and a second end face, the mode spaces of the laser diodes are arranged alongside one another in a y-direction, a trench is provided in the semiconductor layer between two mode spaces, the trenches extend in the x-direction from the first end face to the second end face, the trenches extend from a top side of the semiconductor layer in a z-direction to a predefined depth in the direction of the active zone, a second laser diode is arranged between two of the trenches, a second mode space of the second laser diode extends in the x-direction between the first end face and the second end face, a second trench is provided between the two laser diodes arranged between the two trenches, the second trench extends along the x-direction from the first end face to the second end face, and the second trench comprises a smaller width in the y direction than the trench,
wherein the plurality of layers and the active zone of the first laser diode and the plurality of layers and the active zone of the second laser diode are identical.

2. The laser bar according to claim 1, wherein the semiconductor layer is arranged on a substrate, wherein the trenches extend from a top side of the semiconductor layer in the z-direction right into the active zone, wherein the trenches stop within the semiconductor layer with a distance from the substrate.

3. The laser bar according to claim 1, wherein the second trench comprises a smaller depth in the z-direction than the first trench.

4. The laser bar according to claim 1, wherein the semiconductor layer is arranged on a substrate, wherein the second trench extends in the z-direction right into the active zone of the laser diodes, wherein the second trench stops within the semiconductor layer with a distance from the substrate.

5. The laser bar according to claim 1, wherein absorbing material is arranged in at least one second trench, and the absorbing material is configured to at least partly absorb an electromagnetic radiation generated by a laser diode.

6. The laser bar according to claim 1, wherein the semiconductor layer is arranged on a substrate, and the trenches and/or the second trench extend into the substrate.

7. The laser bar according to claim 1, wherein the laser bar is mounted on a carrier, and the carrier is formed as a heat sink.

8. The laser bar according to claim 1, wherein the laser bar is mounted on a carrier, wherein the carrier is formed as a heat sink, and the laser bar is mounted onto the carrier by the side in which the trenches are introduced.

9. The laser bar according to claim 1, wherein the trenches comprise a width in the y-direction of 1 to 100 µm.

10. The laser bar according to claim 1, wherein the second trench comprises a width in the y-direction of 1 to 100 µm.

11. The laser bar according to claim 1, wherein absorbing material is arranged in the second trench, the absorbing material is configured to at least partly absorb an electromagnetic radiation generated by a laser diode, and the absorbing material is filled into the second trench.

12. The laser bar according to claim 1, wherein absorbing material is arranged in the second trench, the absorbing material is configured to at least partly absorb an electromagnetic radiation generated by a laser diode, and the absorbing material has better thermal conductivity than the material of the semiconductor layer.

13. The laser bar according to claim 1, wherein absorbing material is arranged in the second trench, the absorbing material is configured to at least partly absorb an electromagnetic radiation generated by a laser diode, and the absorbing material comprises a metal or consists of a metal.

14. The laser bar according to claim 1, wherein absorbing material is arranged in the second trench, the absorbing material is configured to at least partly absorb an electromagnetic radiation generated by a laser diode, an insulation layer is formed between the absorbing material and the semiconductor layer at least in a section of the second trench, and/or an insulation layer is formed between the absorbing material and the semiconductor layer at least in a section of the trench.

15. The laser bar according to claim 1, wherein absorbing material is arranged in the second trench, the absorbing material is configured to at least partly absorb an electromagnetic radiation generated by a laser diode, an insulation layer is formed between the absorbing material and the semiconductor layer at least in a section of the second trench, the second trench, the absorbing material and the insulation layer are led right under the active zone, the absorbing material is electrically conductive, the absorbing material of the second trench is connected to an electrical line, and the absorbing material constitutes an electrical through contact for the semiconductor layer under the active zone.

16. The laser bar according to claim 1, wherein absorbing material is arranged in a trench, the absorbing material is configured to at least partly absorb an electromagnetic radiation generated by a laser diode, an insulation layer is formed between the absorbing material and the semiconductor layer at least in a section of the trench, the trench, the absorbing material and the insulating layer are led right under the active zone, the absorbing material of the trench is electrically conductive, the absorbing material of the trench is connected to an electrical line, and the absorbing material constitutes an electrical through contact for the semiconductor layer under the active zone.

17. A method of producing the laser bar according to claim 1, the laser bar comprising a semiconductor layer comprising a plurality of layers and comprising an active zone, wherein the active zone is arranged in an x-y-plane, laser diodes each form a mode space in an x-direction between a first end face and a second end face two end faces, the mode spaces of the laser diodes are arranged alongside one another in a y-direction, a trench is provided in the semiconductor layer between two mode spaces, the trenches extend in the x-direction from the first end face to the second end face, the trenches extend from a top side of the semiconductor layer in a z-direction to a predefined depth in the direction of the active zone, a second laser diode is arranged between two of the trenches, a second mode space of the second laser diode extends in the x-direction between the first end face and the second end face, a second trench is provided between the two laser diodes arranged between the two trenches, the second trench extends along the x-direction from the first end face to the second end face, and the second trench comprises a smaller width in the y direction than the trench, wherein the plurality of layers and the active zone of the first laser diode and the plurality of layers and the active zone of the second laser diode are identical, wherein first the semiconductor layer is deposited on the substrate, and then the trenches and the second trench are formed in the semiconductor layer.

* * * * *